United States Patent
Jung et al.

(10) Patent No.: US 9,202,398 B2
(45) Date of Patent: Dec. 1, 2015

(54) DISPLAY MODULE OF DISPLAY DEVICE

(71) Applicant: Samsung Display Co., Ltd., Yongin, Gyeonggi-do (KR)

(72) Inventors: Dong Hoon Jung, Asan-si (KR); Kyu-Hun Shim, Seoul (KR); Sang Heon Ye, Cheonan-si (KR); Jae Suk Yoo, Seoul (KR); Hyun Woo Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 331 days.

(21) Appl. No.: 13/734,065

(22) Filed: Jan. 4, 2013

(65) Prior Publication Data

US 2014/0078719 A1  Mar. 20, 2014

(30) Foreign Application Priority Data

Sep. 18, 2012 (KR) ........................ 10-2012-0103158

(51) Int. Cl.
*G09F 13/04* (2006.01)
*H05K 7/14* (2006.01)
*H05K 5/02* (2006.01)
*H05K 9/00* (2006.01)

(52) U.S. Cl.
CPC  *G09F 13/04* (2013.01); *H05K 5/02* (2013.01); *H05K 7/14* (2013.01); *H05K 9/0054* (2013.01)

(58) Field of Classification Search
CPC ............ G02B 6/0083; G02F 1/133608; G02F 2001/133612; G09F 13/04; H05K 7/14; H05K 5/02; H05K 9/0054; H05K 13/0023

USPC ........... 362/97.1, 97.2, 362, 632–634; 349/58
See application file for complete search history.

(56) References Cited

U.S. PATENT DOCUMENTS

| | | | |
|---|---|---|---|
| 6,282,101 B1 | 8/2001 | Hanas et al. | |
| 7,184,117 B2 | 2/2007 | Suzuki | |
| 7,800,730 B2 | 9/2010 | Kang et al. | |
| 7,911,555 B2 * | 3/2011 | Fukayama et al. | 349/58 |
| 8,008,846 B2 | 8/2011 | Oishi et al. | |
| 2011/0050871 A1 | 3/2011 | Lee et al. | |
| 2011/0199554 A1 | 8/2011 | Isami et al. | |

FOREIGN PATENT DOCUMENTS

| | | |
|---|---|---|
| JP | 2006-146087 | 6/2008 |
| KR | 102050104866 | 11/2005 |
| KR | 1020050104866 | 11/2005 |
| KR | 1020070122266 | 12/2007 |
| KR | 1020080010194 | 1/2008 |
| KR | 1020090016971 | 2/2009 |
| KR | 1020110046844 | 5/2011 |

\* cited by examiner

*Primary Examiner* — Anh Mai
*Assistant Examiner* — Meghan Ulanday
(74) *Attorney, Agent, or Firm* — F. Chau & Associates, LLC

(57) ABSTRACT

A display module of a display device includes a display panel, a middle frame configured to seat and fix the display panel, an upper receiving frame including a front part covering an edge part of an upper surface of the display panel and a side part covering the side surfaces of the display panel and the middle frame and a one-sided conductive rubber pad located between the upper receiving frame and the display panel. The one-sided conductive rubber pad includes a conductive first surface and a non-conductive second surface facing each other, the first surface faces the display panel, and the second surface is in contact with the upper receiving frame.

31 Claims, 5 Drawing Sheets

DISPLAY MODULE OF DISPLAY DEVICE

CROSS-REFERENCE TO RELATED APPLICATION

This application claims priority to Korean Patent Application No. 10-2012-0103158 filed on Sep. 18, 2012, the disclosure of which is hereby incorporated by reference herein in its entirety.

TECHNICAL FIELD

The present disclosure relates to a display module of a display device.

DISCUSSION OF THE RELATED ART

Display devices include self-light emitting display devices, which emit light by themselves such as, for example, a light emitting diode (LED) display device, an electric field emissive display (FED) device, a vacuum fluorescent display (VFD), a plasma display panel (PDP) and the like, and light receiving display devices, which cannot emit light by themselves and require a light source, such as, for example, a liquid crystal display (LCD), an electrophoretic display and the like.

In general, the display device includes a display module and a driver for driving the display module.

A display module of the light receiving display device includes a display panel and a backlight unit for supplying light to the display panel. The display module includes a case for clamping the display panel and the backlight unit to each other for unification to prevent light loss and for covering and protecting the display module to prevent the display module from being damaged by external impact.

The backlight unit includes a light source package including at least one light source for generating light. Examples of the light source include but are not limited to a cold cathode fluorescent lamp (CCFL), a flat fluorescent lamp (FFL), a light emitting diode (LED) and the like. Recently, the light emitting diode (LED) which has low power consumption and low calorific values is frequently being used as the light source.

The backlight unit should uniformly emit light to a back surface of the display panel, and may be divided into, for example, a direct type backlight unit, an edge type backlight unit and the like according to a position of the light source in the backlight unit.

The display panel includes a plurality of pixels including a switching element and a plurality of signal lines. The signal line includes a gate line for transmitting a gate signal and a data line for transmitting a data signal. The switching element of each pixel is connected to the gate line and the data line to receive a data voltage.

The driver of the display device includes a gate driver for generating a gate signal, a data driver for generating a data signal, a signal controller and the like. The drivers may be mounted to the display panel in, for example, at least one integrated circuit chip type, attached to the display panel in a TCP type, or integrated on the display panel.

As described above, as the display panel may include various electronic elements, the display panel can generate static electricity and electromagnetic waves, and may be required to properly block or release the static electricity and electromagnetic waves.

SUMMARY

Exemplary embodiments of the present invention provide a display module which can readily emit or block an electrostatic discharge, an electromagnetic radiation or the like generated in a display panel of a display device.

Also, exemplary embodiments of the present invention reduce manufacturing costs of the display module and simplify a manufacturing process.

An exemplary embodiment of the present invention provides a display module of a display device including: a display panel, a middle frame configured to seat and fix the display panel, an upper receiving frame including a front part covering an upper surface of an edge part of the display panel and a side part covering the side surfaces of the display panel and the middle frame, and a one-sided conductive rubber pad located between the upper receiving frame and the display panel. The one-sided conductive rubber pad includes a conductive first surface and a non-conductive second surface facing each other, the first surface faces the display panel, and the second surface is in contact with the upper receiving frame.

The display module may further include a conductive tape electrically connected to the first surface of the one-sided conductive rubber pad and disposed between the display panel and the one-sided conductive rubber pad.

Both of two side surfaces of the conductive tape may be conductive.

The display module may further include a lower receiving frame clamped to the upper receiving frame and located under the display panel and the middle frame.

The conductive tape may include a part located between the upper receiving frame and the lower receiving frame at a clamp portion of the upper receiving frame and the lower receiving frame.

The one-sided conductive rubber pad may include a plurality of band type rubber pads separated from each other.

Each of the plurality of band type rubber pads may be attached to an inner surface of the upper receiving frame and extend lengthily along a side of the upper receiving frame.

A plurality of conductive tapes may be provided, and the upper receiving frame includes a pair of long sides and a pair of short sides each shorter than the long side, and two of the plurality of conductive tapes may be attached to the pair of short sides of the upper receiving frame.

A thickness of the conductive tape may be no less than an assembly error tolerance of the upper receiving frame and the lower receiving frame.

The lower receiving frame may be conductive.

A light source package located over the lower receiving frame may be further comprised.

According to an exemplary embodiment, a display device is provided. The display device includes a display panel and a case. The case includes a middle frame configured to seat and fix the display panel, an upper receiving frame including a front part covering an upper surface of an edge portion of the display panel and a side part covering side surfaces of the display panel and the middle frame, a lower receiving frame clamped to the upper receiving frame and located under the display panel and the middle frame, a one-sided conductive rubber pad located between the upper receiving frame and the display panel in which the one-sided conductive rubber pad includes a conductive first surface and a non-conductive second surface face each other, the first surface faces the display panel, and the second surface is in contact with the upper receiving frame, and a conductive tape having a first surface in contact with the one-sided conductive rubber pad and a second surface in contact with the lower receiving frame.

The display device further includes a backlight unit disposed on a rear surface of the display panel and configured to supply light to the display panel. The backlight unit includes a light source package received in the lower receiving frame, a diffusion plate seated on a surface of the lower receiving frame located above the light source package, and an optical sheet disposed on an upper surface of the diffusion sheet. Moreover, the middle frame is clamped to the lower receiving frame to fix and protect the display panel and fix the diffusion plate and the optical sheet of the backlight unit together with the lower receiving frame.

According to the exemplary embodiments of the present invention, a display panel, which can readily emit or block an electrostatic discharge, an electromagnetic radiation or the like generated in a display panel of a display device, is provided.

Further, it is possible to reduce a manufacturing cost of the display module and simplify a manufacturing process.

BRIEF DESCRIPTION OF THE DRAWINGS

Exemplary embodiments of the present invention can be understood in more detail from the following detailed description taken in conjunction with the accompanying drawings in which.

DETAILED DESCRIPTION OF EXEMPLARY EMBODIMENTS

Figure 1:
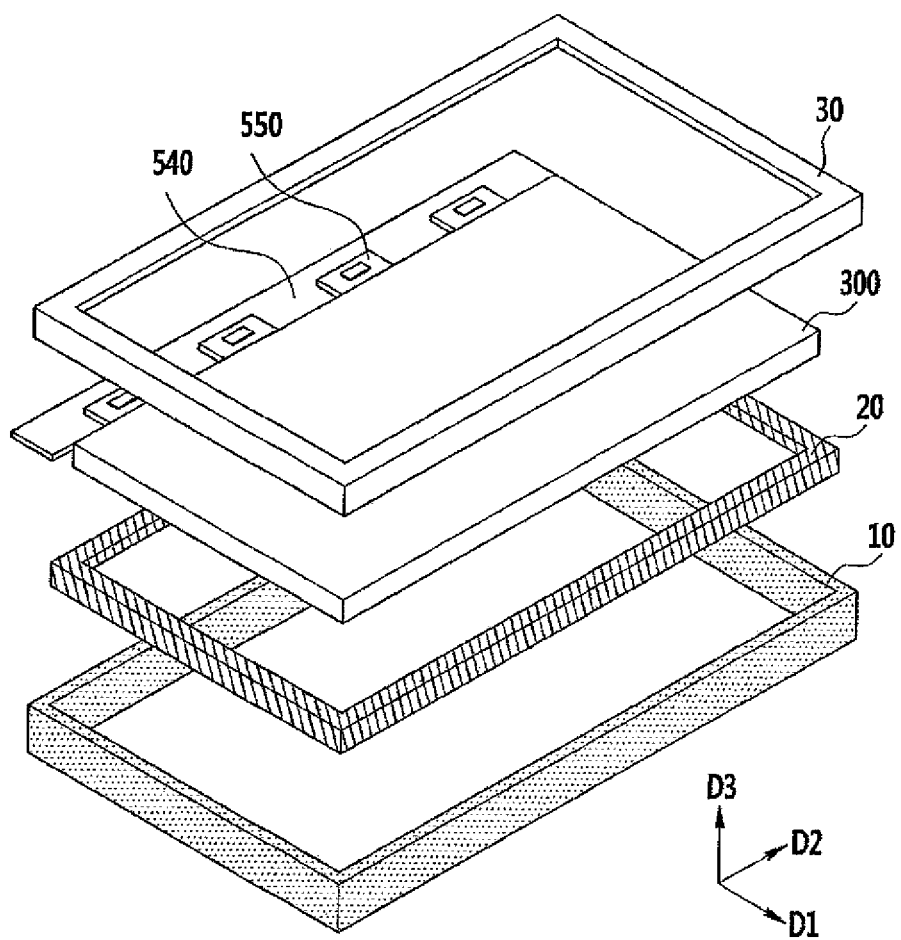
FIG. 1 is an exploded perspective view of a display device including a display module according to an exemplary embodiment of the present invention.

Exemplary embodiments of the present invention will be described more fully hereinafter with reference to the accompanying drawings, in which exemplary embodiments of the invention are shown.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

First, a display device according to an exemplary embodiment of the present invention will be described with reference to FIGS. 1 and 2.

Figure 2:
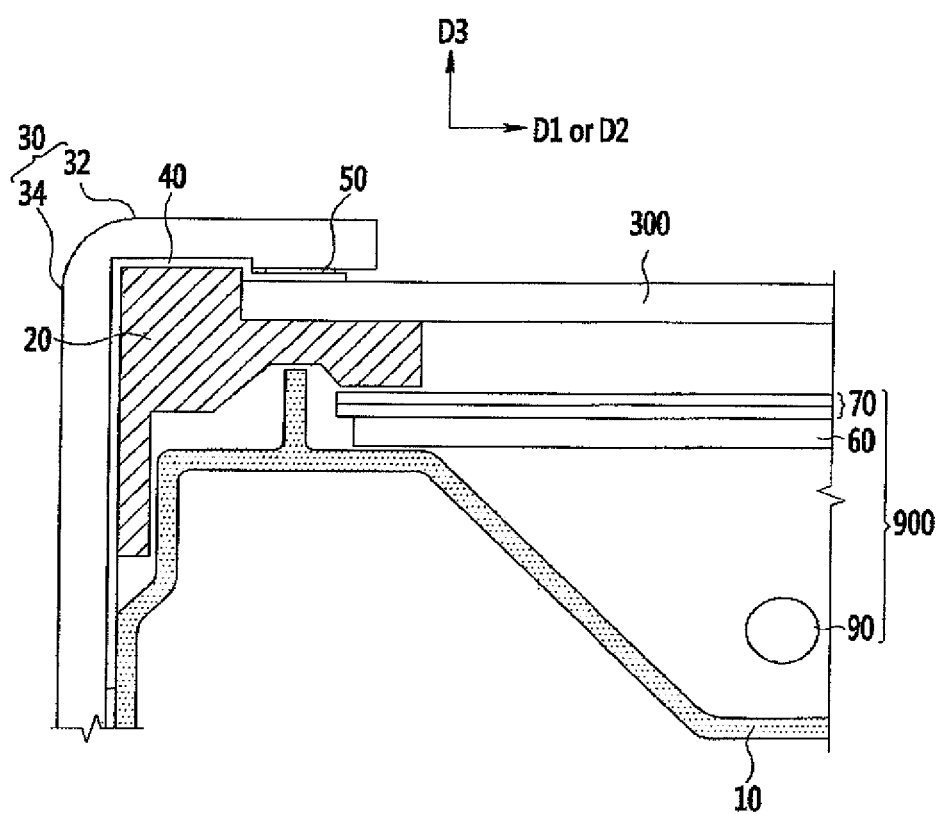
FIG. 2 is a cross-sectional view of a display module according to an exemplary embodiment of the present invention.

FIG. 1 is an exploded perspective view of a display device including a display module according to an exemplary embodiment of the present invention, and FIG. 2 is a cross-sectional view of a display module according to an exemplary embodiment of the present invention.

Referring to FIGS. 1 and 2, a display device according to an exemplary embodiment of the present invention includes, for example, a display panel 300 and a case for fixing and supporting the display panel 300.

The case includes, for example, a lower receiving frame (also referred to as a "bottom chassis") 10, a middle frame (also referred to as a "middle mold) 20, an upper receiving frame (also referred to as a "top mold") 30, a conductive tape (also referred to as an "EMI tape") 40, a one-sided conductive rubber pad 50 and the like.

When the display device is a light receiving display device, the display device may further include, for example, a backlight unit 900 for supplying light to the display panel 300. In this case, the case can fix and support the display panel 300 and the backlight unit 900 together. In an exemplary embodiment of the present invention, the display device including the backlight unit 900 will be described as an example.

The display panel 300 may be a display panel included in various flat panel displays (FPDs) such as, for example, a liquid crystal display (LCD), an organic light emitting display OLED, an electrowetting display (EWD) and the like. When the display panel is the liquid crystal display, the display panel 300 may include lower and upper display panels (not shown) facing each other and a liquid crystal layer (not shown) between the lower and upper display panels in an aspect of a cross-sectional structure. For example, the display panel 300 of the display device according to an exemplary embodiment of the present invention may be a display panel of the light receiving display device, and the backlight unit 900 may be omitted in the self-light emitting display device such as the organic light emitting device.

The display panel 300 includes, for example, a plurality of signal lines and a plurality of pixels connected to the plurality of signal lines and arranged approximately in a matrix form. The signal lines include, for example, a plurality of gate lines (not shown) for transmitting a gate signal and a plurality of data lines (not shown) for transmitting a data voltage.

Each pixel may include, for example, at least one switching element connected to a corresponding gate line and a corresponding data line, and at least one pixel electrode connected to the switching element. The switching element may include, for example, at least one thin film transistor, and may be turned on or off according to the gate signal transmitted by the gate line to selectively transmit the data voltage transmitted by the data line to the pixel electrode. Each pixel can display an image of corresponding luminance according to the data voltage applied to the pixel electrode.

The display panel 300 may be electrically connected to the driver through, for example, a tape carrier package (TCP) 550 and the like as illustrated in FIG. 1. For example, the driver may be mounted to the TCP 550 in at least one integrated circuit chip type, or mounted to a printed circuit board (PCB) connected to the TCP 550. Alternatively, the driver may be mounted, for example, to the display panel 300 in at least one integrated circuit chip type, or integrated on the display panel together with the signal line, the thin film transistor and the like.

Referring to FIG. 1, a surface of the display panel 300 may be extended, for example, in a first direction D1 and a second direction D2 orthogonal to each other, and a normal with respect to the surface of the display panel 300 may face a third direction D3. In an exemplary embodiment of the present invention, when the display panel 300 includes a long side and a short side which are edge sides having different lengths, the short side may, for example, extend in the first direction D1 and the long side may extend in the second direction D2.

For example, the printed circuit board 540 and the TCP 550 may be attached to one of the two long sides of the display panel 300 facing each other.

The backlight unit 900 is located, for example, in a rear surface of the display panel 300 of the light receiving display device to emit light to the display panel 300. The backlight unit 900 may emit light in, for example, the third direction D3.

Referring to FIG. 2, the backlight unit 900 may include, for example, a diffusion plate 60, an optical sheet 70, a light source package 90 and the like.

The diffusion plate 60 is located, for example, in an upper part of the light source package 90 and uniformly diffuses light incident from the light source package 90, so that the uniformity of luminance of the light may be increased. That is, the diffusion plate 60 can prevent the light from being locally concentrated by diffusing the light incident from the light source package 90.

Optical sheet 70 may include, for example, at least one optical sheet such as a prism sheet, and increase luminance, uniformity and the like of the light having penetrated the diffusion plate 60 and enhance light efficiency. In an exemplary embodiment, the optical sheet 70 may further include, for example, a protection sheet positioned above the prism sheet which prevents contamination and damage to the prism sheet from dust or scratches, and may prevent movement of the prism sheet.

The light source package 90 includes, for example, at least one light source (also referred to as a "light-emitting device"), and examples of the light source include but are not limited to a cold cathode fluorescent lamp (CCFL), a flat fluorescent lamp (FFL), the light emitting diode (LED) and the like.

Referring to FIGS. 1 and 2, the lower receiving frame 10, the middle frame 20, and the upper receiving frame 30 can fix and support the display panel 300 and the backlight unit 900.

The lower receiving frame 10 can receive the light source package 90 of the backlight unit 900 and provide an area for seating the diffusion plate 60 and the optical sheet 70. An internal surface of the lower receiving frame 10 includes, for example, a reflective surface and reflects the light emitted from the light source package 90 upwardly to the display panel 300, so that leakage of the light is prevented. The lower receiving frame 10 may be formed of, for example, a conductive material.

The middle frame 20 is clamped to the lower receiving frame 10 to fix and protect the display panel 300 and fix the diffusion plate 60 and the optical sheet 70 of the backlight unit 900 together with the lower receiving frame 10. The middle frame 20 may include, for example, an upper groove for seating the display panel 300 as illustrated in FIG. 2.

The upper receiving frame 30 includes, for example, an opening for exposing a display area of the display panel 300 to an outside. The upper receiving frame 30 may have, for example, a quadrangular band form including a front part 32 for covering an edge part of an upper surface of the display panel 300 and a side part 34 for surrounding or covering side surfaces of the display panel 300 and the backlight unit 900 and a side surface of the middle frame 20. The front part 32 and the side part 34 of the upper receiving frame 30 may be, for example, bent to be approximately orthogonal to each other. Referring to FIGS. 1 and 2, the front part 32 of the upper receiving frame 30 may face, for example, the third direction D3 and the side part 34 may face the first direction D1 or the second direction D2. The display panel 300 seated on the middle frame 20 is disposed within the upper receiving frame 30 and then fixed. The upper receiving frame 30 includes, for example, an insulating material such as plastic and the like and thus may be non-conductive.

When the display panel 300 includes a pair of long sides and a pair of short sides as described above, the upper receiving frame 30 may also include, for example, a pair of long sides and a pair of short sides in accordance with the pair of long sides and the pair of short sides of the display panel 300. The short side of the upper receiving frame 30 may extend, for example, in the first direction D1, and the long side may extend in the second direction D2.

The one-sided conductive rubber pad 50 and the conductive tape 40 will now be described with reference to FIGS. 3 to 6 together with the above described figures.

Figure 3:
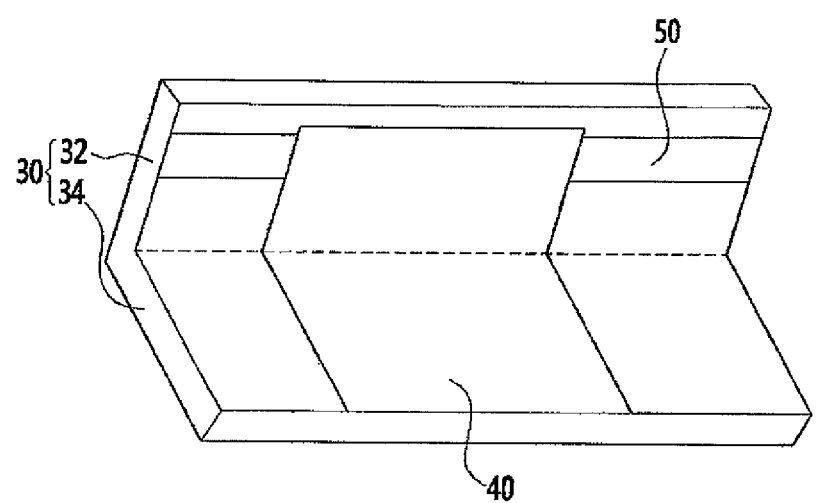
FIG. 3 is an internal perspective view of a part of a display module according to an exemplary embodiment of the present invention.
Figure 4:
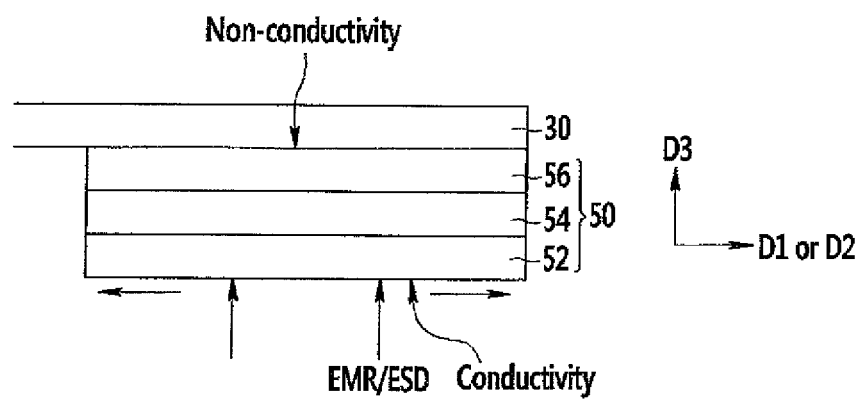
FIG. 4 is a cross-sectional view of a one-sided conductive rubber pad of a display module according to an exemplary embodiment of the present invention.
Figure 5:
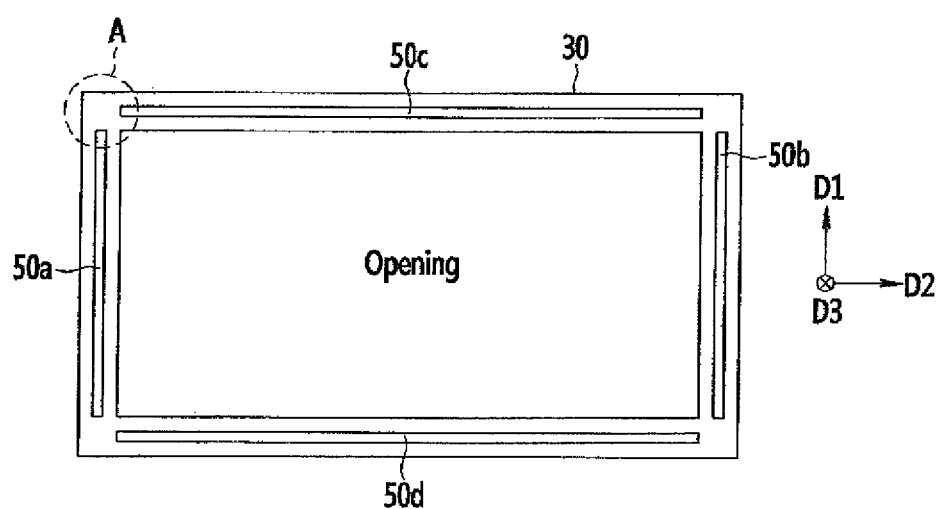
FIG. 5 is a rear view of an upper receiving frame of a display panel according to an exemplary embodiment of the present invention.
Figure 6:
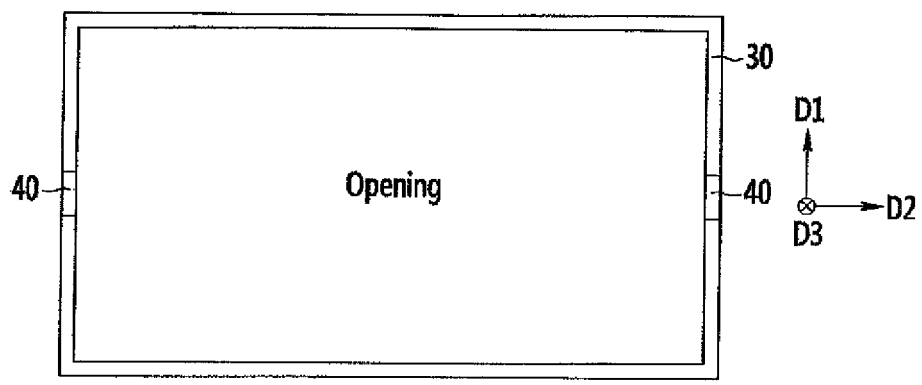
FIG. 6 is a schematic top plan view of a display panel according to an exemplary embodiment of the present invention.

FIG. 3 is an internal perspective view of a part of the display module according to an exemplary embodiment of the present invention, FIG. 4 is a cross-sectional view of the one-sided conductive rubber pad of the display module according to an exemplary embodiment of the present invention, FIG. 5 is a rear view of the upper receiving frame of the display panel according to an exemplary embodiment of the present invention, and FIG. 6 is a schematic top plan view of the display module according to an exemplary embodiment of the present invention.

Referring to FIGS. 2 and 3, the conductive tape 40 and the one-sided conductive rubber pad 50 are attached to, for example, the internal side of the front part 32 of the upper receiving frame 30. In an area where the conductive tape 40 and the one-sided conductive rubber pad 50 intersect, the one-sided conductive rubber pad 50 is located, for example, between the conductive tape 40 and the upper receiving frame 30.

Referring to FIG. 3, the one-sided conductive rubber pad 50 may be attached, for example, along an edge side of the front part 32 of the upper receiving frame 30 in a lengthily extending form.

The one-sided conductive rubber pad 50 is, for example, a horizontal conductive rubber pad, and only one of the two surfaces facing each other is conductive and the other is non-conductive. The non-conductive surface is attached to, for example, an internal surface of the front part 32 of the upper receiving frame 30 and the conductive surface faces the display panel 300 and the conductive tape 40 as illustrated in FIG. 4.

The conductive surface of the one-sided conductive rubber pad 50 is, for example, in contact with the display panel 300 along the edge of the display panel 300 or electrically connected to the display panel 300 to transmit or discharge an electrostatic discharge (ESD) or an electromagnetic radiation (EMR) generated in the display panel 300. The ESD or EMR transmitted to the conductive surface of the one-sided conductive rubber pad 50 may be transmitted, for example, along the conductive surface which is a horizontal surface without being transmitted in the third direction D3.

When the upper receiving frame 30 is non-conductive like an exemplary embodiment of the present invention, the ESD or EMR generated in the display panel 300 cannot be emitted even though the ESD or EMR is transmitted to the upper receiving frame 30. Accordingly, by making the surface of the one-sided conductive rubber pad 50 being in contact with the upper receiving frame 30 non-conductive like an exemplary embodiment of the present invention, it is possible to prevent the ESD or EMR from being unnecessarily transmitted to the upper receiving frame 30 and increase emission and discharge efficiencies of the ESD or EMR.

The one-sided conductive rubber pad 50 according to an exemplary embodiment of the present invention may have, for example, elasticity.

In a description of an example of a cross-sectional structure of the one-sided conductive rubber pad 50 with reference to FIG. 4, the one-sided conductive rubber pad 50 according to an exemplary embodiment of the present invention may include, for example, a conductive layer 52, a conductive foam 54, an adhesive layer 56 and the like laminated in the third direction D3. The conductive layer 52 may include, for example, a conductive non-woven fabric and the like. For example, in an exemplary embodiment, the conductive non-woven fabric of the conductive layer 52 may include synthetic fibers such as polyester, polyamide or polypropylene blended together with metal fibers such as carbon steel, stainless steel, copper, brass, aluminum or nickel into a bonded web.

The conductive foam 54 may include, for example, a polyolefin foam and the like. For example, the polyolefin foam may include polyethylene, polypropylene, ethylene propylene copolymer, ethylene butene copolymer, ethylene octene copolymer, or any combination thereof. Alternatively, in an exemplary embodiment, the conductive foam 54 may include, for example, a conductive polyurethane foam.

The adhesive layer 56 may include, for example, a non-conductive acryl-based adhesive material. Alternatively, in an exemplary embodiment, the adhesive layer 56 may include, for example, a silicon-based adhesive material (e.g., silicon rubber adhesive). The adhesive layer 56 allows the one-sided conductive rubber pad 50 to be attached to the upper receiving frame 30.

As described, the one-sided conductive rubber pad 50 according to an exemplary embodiment of the present invention is implemented such that only one surface is conductive, so that the one-sided conductive rubber pad 50 may reduce manufacturing costs in comparison with a double-sided conductive rubber pad.

Referring to FIG. 5, the one-sided conductive rubber pad 50 includes, for example, two or more of band type rubber pads 50a, 50b, 50c, and 50d separated from each other. For example, in an exemplary embodiment, the one-sided conductive rubber pad 50 may include three or more of band type rubber pads 50a, 50b, 50c, and 50d. When the one-sided conductive rubber pad 50 includes two band type rubber pads, the two band type rubber pads may, for example, be attached along short sides of the upper receiving frame 30 facing each other, respectively.

FIG. 5 illustrates an example where the one-sided conductive rubber pad 50 includes the four band type rubber pads 50a, 50b, 50c, and 50d. Two band type rubber pads 50a, 50b, 50c, and 50d of the upper receiving frame 30, which are attached along the two adjacent sides meeting each other, such as a part "A" may intersect or do not meet each other. As only one surface of the one-sided conductive rubber pad 50 is conductive, although two adjacent one-sided conductive rubber pads 50 intersect or meet, ESD or EMR cannot be directly transmitted. Further, by separately attaching the adjacent two conductive rubber pads 50 extending along different sides, an attachment operation efficiency may be increased.

As illustrated in FIG. 5, when the one-sided rubber pad 50 includes, for example, four band type rubber pads, two band type rubber pad 50a and 50b may be lengthily attached along short sides of the upper receiving frame 30, respectively, and two band type rubber pads 50c and 50d may be lengthily attached along long sides of the upper receiving frame 30. At least one of the band type rubber pads 50c and 50d attached along the long sides of the upper receiving frame 30 may be omitted, and accordingly costs of the one-sided conductive rubber pad 50 may be reduced.

Referring back to FIGS. 2 and 3, the conductive tape 40 is attached, for example, to inner surfaces of the front part 32 and the side part 34 of the upper receiving frame 30. The conductive tape 40 is, for example, in contact with the conductive surface of the one-sided conductive rubber pad 50 in the front part 32 of the upper receiving frame 30 to be electrically connected to the one-sided conductive rubber pad 50, and extends to an end part of the side part 34 of the upper receiving frame 30 via a bending part of the upper receiving frame 30.

The conductive tape 40 extending to the side part 34 of the upper receiving frame 30 frame 30 is, for example, located between the upper receiving frame 30 and the middle frame 20 or between the upper receiving frame 30 and the lower receiving frame 10. For example, the conductive tape 40 located between the upper receiving frame 30 and the lower receiving frame 10 is in contact with both the upper receiving frame 30 and the lower receiving frame 10 at a clamp portion of the upper receiving frame 30 and the lower receiving frame 10. The conductive tape 40 located between the upper receiving frame 30 and the lower receiving frame 10 may be simply fixed when the upper receiving frame 30 and the lower receiving frame 10 are clamped to each other.

The conductive tape 40 is, for example, a horizontal and vertical conductive tape whose both surfaces are all conductive, and allows an electric current to flow in a direction perpendicular to the surface. Accordingly, as illustrated in FIG. 2, when one surface (first surface) of the conductive tape 40 is in contact with the one-sided conductive rubber pad 50 and the other surface (second surface) is in contact with the lower receiving frame 10, the ESD and the EMR received from the one-sided conductive rubber pad 50 by being in contact with the one-sided conductive rubber pad 50 through the first surface is transmitted along the conductive tape 40, and then transmitted to the lower receiving frame 10 through the second surface being in contact with the lower receiving frame 10. Therefore, the ESD and the EMR generated in the display panel 300 may be readily emitted or discharged to the outside sequentially via the one-sided conductive rubber pad 50, the conductive tape 40, and the lower receiving frame 10.

A thickness of the conductive tape 40 may be determined, for example, considering an assembly error tolerance between the upper receiving frame 30 and the lower receiving frame 10. For example, the thickness of the conductive tape 40 may be equal or larger than the assembly error tolerance between the upper receiving frame 30 and the lower receiving frame 10 to allowable the conductive tape 40 to effectively emit or discharge the ESD or the EMR to the lower receiving frame 10. Here, the assembly error tolerance between the upper receiving frame 30 and the lower receiving frame 10 may be, for example, a margin of error of a distance between the upper receiving frame 30 and the lower receiving frame 10 considered when clamping the upper receiving frame 30 and the lower receiving frame 10 to each other.

Referring to FIG. 6, the display module according to an exemplary embodiment of the present invention may include, for example, two or more conductive tapes 40. For example, two or more conductive tapes 40 are first attached to short sides of the upper receiving frame 30, and when there are the remaining conductive tapes, the remaining conductive tapes may be attached to long sides of the upper receiving frame 30. However, the number and the position of the conductive tapes 40 are not limited thereto and may be variously changed.

As described above, by transmitting the ESD or the EMR generated in the display panel 300 through the one-sided conductive rubber pad 50 and transmitting again the ESD and the EMR to the lower receiving frame 10 through the conductive tape 40 connected to the conductive surface of the one-sided conductive rubber pad 50, it is possible to obtain a display module having an effect of effectively emitting or blocking the ESD or the EMR with a relatively simple manufacturing process and at a relatively inexpensive cost. That is, according to exemplary embodiments of the present invention, the one-sided conductive rubber pad 50 does not need to be double-sided conductive in a structure where the upper receiving frame 30 is non-conductive, and as the one-sided conductive rubber pad 50 is attached to the upper receiving frame 30 and then is electrically connected to the lower receiving frame 10 through the conductive tape 40 and grounded, a simpler and effective structure may be obtained and the manufacturing costs may be reduced.

Further, according to exemplary embodiments of the present invention, as the conductive tape 40 is electrically connected to the lower receiving frame 10 naturally without a separate complex transfer means such as, for example, a screw when the upper receiving frame 30 and the lower receiving frame 10 are clamped to each other, it is possible to simplify a manufacturing method of the display module and reduce manufacturing costs.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A display module of a display device comprising:
a display panel;
a middle frame configured to seat and fix the display panel;
an upper receiving frame including a front part covering an upper surface of an edge portion of the display panel and a side part covering side surfaces of the display panel and the middle frame; and
a one-sided conductive rubber pad located between the upper receiving frame and the display panel,
wherein the one-sided conductive rubber pad includes a conductive first surface and a non-conductive second surface, the first surface faces the display panel, and the second surface is in contact with the upper receiving frame.

2. The display module of claim 1, further comprising: a conductive tape electrically connected to the first surface of the one-sided conductive rubber pad and disposed between the display panel and the one-sided conductive rubber pad.

3. The display module of claim 2, wherein both of two side surfaces of the conductive tape are conductive.

4. The display module of claim 3, further comprising: a lower receiving frame clamped to the upper receiving frame and located under the display panel and the middle frame.

5. The display module of claim 4, wherein the conductive tape includes a part located between the upper receiving frame and the lower receiving frame at a clamp portion of the upper receiving frame and the lower receiving frame.

6. The display module of claim 5, wherein the one-sided conductive rubber pad includes a plurality of band type rubber pads separated from each other.

7. The display module of claim 6, wherein each of the plurality of band type rubber pads is attached to an inner surface of the upper receiving frame and extend lengthily along a side of the upper receiving frame.

8. The display module of claim 7, wherein a plurality of two conductive tapes are provided, and the upper receiving frame includes a pair of long sides and a pair of short sides each shorter than the long side, and two of the plurality of conductive tapes are attached to the pair of short sides of the upper receiving frame.

9. The display module of claim 8, wherein a thickness of the conductive tape is no less than an assembly error tolerance of the upper receiving frame and the lower receiving frame.

10. The display module of claim 9, wherein the lower receiving frame is conductive.

11. The display module of claim 2, further comprising: a lower receiving frame clamped to the upper receiving frame and located under the display panel and the middle frame.

12. The display module of claim 11, wherein the conductive tape includes a part located between the upper receiving frame and the lower receiving frame at a clamping portion of the upper receiving frame and the lower receiving frame.

13. The display module of claim 12, wherein a thickness of the conductive tape is no less than an assembly error tolerance of the upper receiving frame and the lower receiving frame.

14. The display module of claim 11, wherein the one-sided conductive rubber pad includes a plurality of band type rubber pads separated from each other.

15. The display module of claim 14, wherein each of the plurality of band type rubber pads is attached to an inner surface of the upper receiving frame and extend lengthily along a side of the upper receiving frame.

16. The display module of claim 11, wherein the lower receiving frame is conductive.

17. The display module of claim 11, further comprising: a light source package located over the lower receiving frame.

18. The display module of claim 2, wherein a plurality of conductive tapes are provided, the upper receiving frame includes a pair of long sides and a pair of short sides each shorter than the long side, and two of the plurality of conductive tapes are attached to the pair of short sides of the upper receiving frame.

19. The display module of claim 1, wherein the one-sided conductive rubber pad includes a plurality of band type rubber pads separated from each other.

20. The display module of claim 19, wherein each of the plurality of band type rubber pads is attached to an inner surface of the upper receiving frame and extend lengthily along a side of the upper receiving frame.

21. A display device comprising:
a display panel;
a case comprising:
a middle frame configured to seat and fix the display panel, an upper receiving frame including a front part covering an upper surface of an edge portion of the display panel and a side part covering side surfaces of the display panel and the middle frame, a lower receiving frame clamped to the upper receiving frame and located under the display panel and the middle frame and a one-sided conductive rubber pad located between the upper receiving frame and the display panel,
wherein the one-sided conductive rubber pad includes a conductive first surface and a non-conductive second surface, the first surface faces the display panel, and the second surface is in contact with the upper receiving frame, and a conductive tape having a first surface in contact with the one-sided conductive rubber pad and a second surface in contact with the lower receiving frame; and
a backlight unit disposed on a rear surface of the display panel and configured to supply light to the display panel, wherein the backlight unit includes a light source package received in the lower receiving frame, a diffusion plate seated on a surface of the lower receiving frame located above the light source package, and an optical sheet disposed on an upper surface of the diffusion sheet, wherein the middle frame is clamped to the lower receiving frame to fix and protect the display panel and fix the diffusion plate and the optical sheet of the backlight unit together with the lower receiving frame.

22. The display device of claim 21, wherein an internal surface of the lower receiving frame includes a reflective surface configured to reflect light emitted from the light source package upwardly to the display panel.

23. The display device of claim 21, wherein the middle frame includes an upper groove configured to seat the display panel therein.

24. The display device of claim 21, wherein the upper receiving frame includes an opening exposing a display area of the display panel to an outside.

25. The display device of claim 21, wherein the front part and the side part of the upper receiving frame are bent and approximately orthogonal to each other.

26. The display device of claim 21, wherein the one-sided conductive rubber pad includes an adhesive layer, a conductive foam disposed on the adhesive layer and a conductive layer disposed on the conductive foam, and wherein the adhesive layer of the one-sided conductive rubber pad is configured to attach the one-sided conductive rubber pad to the upper receiving frame.

27. The display device of claim 26, wherein the conductive layer includes a conductive non-woven fabric, the conductive foam includes a polyolefin foam, and the adhesive layer includes a non-conductive acryl-based adhesive material.

28. The display device of claim 21, wherein the lower receiving frame is formed of a conductive material and the upper receiving frame is formed of an insulating material.

29. The display device of claim 21, wherein the conductive tape is in contact with the conductive surface of the one-sided conductive rubber pad in the front part of the upper receiving frame to be electrically connected to the one-sided conductive rubber pad, and extends to an end part of the side part of the upper receiving frame via a bending part of the upper receiving frame.

30. The display device of claim 21, wherein the one-sided conductive rubber pad includes a non-conductive adhesive layer that is configured to attach to the upper receiving frame.

31. The display module of claim 1, wherein the one-sided conductive rubber pad includes a non-conductive adhesive layer that is configured to attach to the upper receiving frame.

* * * * *